United States Patent
Reynolds

(10) Patent No.: US 7,268,585 B1
(45) Date of Patent: Sep. 11, 2007

(54) SYSTEM FOR SIGNAL ROUTING LINE AGGREGATION IN A FIELD-PROGRAMMABLE GATE ARRAY

(75) Inventor: Alan B. Reynolds, Long Valley, NJ (US)

(73) Assignee: Actel Corporation, Mountain View, CA (US)

(*) Notice: Subject to any disclaimer, the term of this patent is extended or adjusted under 35 U.S.C. 154(b) by 0 days.

(21) Appl. No.: 11/027,789

(22) Filed: Dec. 29, 2004

(51) Int. Cl.
*H01L 25/00* (2006.01)
*H03K 19/177* (2006.01)

(52) U.S. Cl. .............................. 326/41; 326/39; 326/47

(58) Field of Classification Search ............ 326/38–41, 326/47
See application file for complete search history.

(56) References Cited

U.S. PATENT DOCUMENTS

| 5,258,668 | A | | 11/1993 | Cliff et al. ................. 307/465 |
| 5,260,611 | A | | 11/1993 | Cliff et al. ................. 307/465 |
| 6,670,825 | B1 | * | 12/2003 | Lane et al. .................. 326/41 |

* cited by examiner

*Primary Examiner*—Anh Q. Tran
(74) *Attorney, Agent, or Firm*—Sierra Patent Group, Ltd.

(57) ABSTRACT

An aggregation interconnect scheme for a programmable logic device provides low-skew routing of high fan-out signals by aggregating regional routing resources, which provide low-skew routing utilizing under-utilized global routing resources.

12 Claims, 8 Drawing Sheets

SYSTEM FOR SIGNAL ROUTING LINE AGGREGATION IN A FIELD-PROGRAMMABLE GATE ARRAY

BACKGROUND

1. Field of the Invention

The invention relates to field-programmable gate array (FPGA) devices. More specifically, the invention is a routing system for reducing signal skew in an FPGA.

2. Background

FPGAs are known in the art. An FPGA comprises any number of logic modules, a routing architecture and programmable elements that may be programmed to selectively interconnect the logic modules to one another and to define the functions of the logic modules. An FPGA is an array of uncommitted gates with uncommitted wiring channels. To implement a particular circuit function, a user circuit is mapped into an array and the wiring channels' appropriate connections are programmed to implement the necessary wiring connections that form the user circuit.

A field programmable gate array circuit can be programmed to implement virtually any set of logic functions. Input signals are processed by the programmed circuit to produce the desired set of outputs. Such inputs flow from a user's system, through input buffers and through the circuit, and finally back out the user's system via output buffers. Such buffers may provide any or all of the following input/output (I/O) functions: voltage gain, current gain, level translation, delay, signal isolation or hysteresis.

An FPGA core tile (tile) may be employed as a stand-alone FPGA, repeated in a rectangular array of tiles, or included with other devices in a system-on-a-chip (SOC). A tile is the basic building block consisting of a logic module and routing resources. An Array of tiles may also be known as a tile. An FPGA tile may also include other components such as read only memory (ROM) modules or random access memory (RAM) modules. Horizontal and vertical routing channels provide interconnections between the various components within an FPGA tile. Connections are provided by programmable elements that form connections between the routing resources.

The programmable elements (cells or switches) in an FPGA can be either one-time programmable or re-programmable. Re-programmable elements used in FPGA technologies may comprise volatile or non-volatile transistors or other re-programmable elements as is well known to those of ordinary skill in the art. One-time programmable elements used in FPGA technologies may comprise antifuse devices.

Edge-triggered storage devices, for example a flip-flops (FFs), within an FPGA may be affected by skew. Skew is the difference in arrival time at two different points for a signal from a common origin, due in part to delay caused by devices that the signal previously passed through. Delay of the clock or clock-enable for each device and throughout a system is one cause of skew.

During design of a user circuit to be implemented in the programmable logic of an FPGA, one objective is to avoid a situation called "shoot-through." Shoot-through occurs when a circuit receives a signal and propagates that signal to the next circuit before the next circuit is ready to receive that signal, according to a desired sequence of signals. The user circuit implemented in the FPGA will not function properly if shoot-through occurs, and shoot-through is more likely to occur when the skew is high on the signal or signals which control the sequence. Shoot-through typically occurs in pipelines or shift registers, but may also occur in a chain of latches where each latch is transparent on opposite values of the enabling signal. Furthermore, high skew may degrade the performance of a user circuit implemented in an FPGA by requiring a waiting period until a signal arrives. Shoot-through on an edge-triggered device cannot be corrected by changing the frequency of the triggering signal.

Fan-out is the number of destinations a signal will reach from a given origin. When a signal will eventually arrive at many different destinations, there is high fan-out. Many circuit designs include high fan-out signals and also high skew, which constrains circuit design in order to avoid shoot-though and other timing errors. Fan-out is a function of the number of destinations to which a signal may propagate, while skew is a function of the difference in arrival time at two different points from a common origin.

High fan-out routing resources are conductors that span a significant number of tiles and are, in combination, capable of carrying signals to substantially any location on a programmable logic device, from any insertion point on the high fan-out routing resource. While the number of insertion points may be limited, insertion points may be reached through ordinary routing resources, and therefore substantially any location on the programmable logic device may be reached from substantially any other location on the programmable logic device, in an efficient manner (i.e., with low insertion delay and low skew) via high fan-out routing resources. High fan-out routing lines are typically much longer than general (inter- and intra-tile) local routing lines. Because of their efficiency and flexibility, high fan-out resources are highly prized by designers who configure programmable logic devices to implement logic functions. High fan-out signals are signals that are distributed to a high number of locations ("landing points") on a device. Typical examples of high fan-out signals requiring high fan-out routing resources are control signals such as clock signals and reset signals. Some data signals may also require high fan-out routing resources.

As FPGAs grow in size, on-chip clock distribution becomes increasingly important. Skew and delay impact FPGA performance and the task of managing skew and delay with conventional means becomes more difficult in large FPGAs.

FIG. 1 is a diagram illustrating a prior art block of FPGA tiles. Tile block 100 is a simplified diagram of a block of FPGA core tiles 110 extending horizontally and vertically in an array.

A tile is a basic unit of programmable logic that includes logic modules and routing resources. In one embodiment, a tile can be configured as a register or a look-up table ("LUT"). In another embodiment, a tile could contain multiple registers and LUTs. Tiles 110, sets of routing resources, or conductors (not shown), and sets of user programmable switches or cells (not shown) associated with both tiles 110 and the routing interconnects are included in the FPGA circuit. When these switches are properly programmed (set to on or off states), tiles 110 and the interconnects of the FPGA are customized or configured to perform specific functions. By reprogramming the on-off states of these switches, an FPGA can perform different functions. Once a specific configuration of an FPGA has been decided upon, it can be configured to perform the function dictated by the configuration. Tiles 110 are, for example, FPGA core tiles that perform functions and may be configured together in various ways in order to implement some overall function or functions within the FPGA. Routing resources, or conductors, connect the tiles into multiple blocks, for example tile block 100 is comprised of multiple tiles, or configurable logic blocks, connected by local routing resources. In a typical FPGA chip there are multiple tile blocks connected together, with conductors connecting the various blocks. Although "connect" and variants are used throughout the specification, one of ordinary skill in the art will recognize that many of the interconnections are programmable and not conducting links until the respective programmable elements are activated. "Connect" and "connected" as used in this disclosure may refer to objects that are physically connected as well as programmably connected or connectable or capable of being connected.

Although many different configurations are possible, one typical example of a block 100 includes a horizontal plurality of sixteen tiles and vertical plurality of twelve tiles, for a total block array size of 16×12=192 tiles 110.

FIG. 2 is a diagram illustrating interconnectivity between two prior art tile blocks of FIG. 1. In FIG. 2, tile blocks 100 include tiles 110 arranged in rows and columns. Each tile in a row of tiles is connectable to each other tile in the row via rows of horizontal regional row conductors (rows) 200. Each horizontal regional row conductor 200 of the tile blocks shown in FIG. 2 is connected (i.e., capable of being connected) to regional vertical conductor 210 (a vertical regional routing resource or spine). Regional vertical conductor 210 extends past many tile blocks. Signal flow is typically unidirectional, for example a signal may only flow from global horizontal conductor 220 to regional vertical conductor 210 and on to one of regional horizontal conductors 200, but not in the other direction. On a unidirectional routing line, the signal may only flow in one direction, from sources to loads. Some programmable logic devices may employ bi-directional routing lines where signals can flow in either direction along the line, depending on how the user circuit is implemented. A signal is typically inserted at the juncture of two routing resources, for example a signal from tile 110-1 may be inserted on to regional vertical conductor 210 and is capable of propagating to all tiles reachable from that conductor.

Global horizontal conductor (rib) 220 provides a signal source for all intersecting regional vertical conductors 210. Global, national, and regional conductors are high fan-out routing resources and are sometimes collectively referred to in the art as "global" routing resources or "global" routing conductors because they are part of the signal routing system that spans multiple tile blocks, even though they do not all span substantially the entire array of tile blocks, as do true "global" conductors. In the present disclosure, "global" generally refers to conductors that span substantially all of the array of tile blocks, but may in certain cases be used to refer to a system of high fan-out routing lines distinguished from low fan-out "local" routing lines, as will be clear from the context.

FIG. 3 is a diagram illustrating interconnectivity between two prior art tile blocks of FIG. 1. In FIG. 3, tile blocks 100 are adjacent to global horizontal conductor 220 and adjacent to regional vertical conductors 210. Each adjacent block 100 separated by a global horizontal conductor 220 has tiles 110 connectable directly to one another by local vertical conductors 300. Block 100-1 has tiles 110 which are connectable to each other and, to varying degrees, to tiles 110 in block 100-2 by local vertical conductors 300. For example, tile 110-1 is directly connectable to tiles 110-2, 110-3 and 110-4 by local vertical conductor 300-1. Tile 110-2 is directly connectable to tiles 110-3, 110-4, and 110-5 by local vertical conductor 300-3. Tile 110-3 is directly connectable to tile 110-4 by local vertical conductor 300-2 and to tiles 110-4, 110-5 and 110-6 by local vertical conductor 300-4. As used in this disclosure, the term "local" is used to identify conductors that only span limited areas and are not part of the high fan-out routing hierarchy. These routing conductors are also referred to as "regular" or "ordinary" routing resources. Although it is possible in some devices to connect enough of these ordinary routing lines to span an entire programmable logic device, a path that long and that passes through many programmable cells or switches would be highly inefficient (i.e., have high skew and high insertion delay). Typically, local conductors do not span an entire row or column of tiles in a block, but may in some instances.

There are typically areas of electrical isolation that separate certain tile blocks and routing resources. For example, vertical areas of electrical isolation may run between columns of the blocks that are not connected to each other via regional horizontal conductors.

Regional horizontal row conductors 200 are typically high fan-out (sometimes referred to as "global") routing resources and local vertical conductors 300 are general routing resources having low fan-out and high skew, necessitating careful circuit design. The fan-out dependent delay and skew of nets that employ principally local routing resources is not predictable. High fan-out routing resources, on the other hand, have predictable delay and skew. The primary use of high-fanout, low-skew routing resources is to route signals that have whole-chip fan-out (or reach) and need to be low-skew. For example, clock signals and reset signals, which may have thousands of loads, are good candidates for routing and distribution via high fan-out resources. Although prior signal routing schemes in programmable logic devices have provided both local routing resources and high fan-out routing resources for local and global signal distribution in the programmable logic devices, there has not been a mechanism for efficiently aggregating high fan-out routing resources to allow their use in local distribution of local signals when not needed for global signal distribution.

SUMMARY OF THE INVENTION

A signal routing architecture for a programmable logic device includes configurable logic blocks connectable by high fan-out routing lines and local routing lines. Aggregation interconnects programmably couple local routing lines to high fan-out routing lines. The aggregation interconnects are configurable to receive a signal from one of the local routing lines and route the signal to at least two of the high fan-out routing lines. The aggregation interconnect is also configurable to electrically connect at least one of the high fan-out routing lines with at least one other of the high fan-out routing lines.

DETAILED DESCRIPTION OF THE INVENTION

Those of ordinary skill in the art will realize that the following description of the present invention is illustrative only and not in any way limiting. Other embodiments of the invention will readily suggest themselves to such skilled persons.

The aggregation scheme of the present invention provides for greater utilization of high fan-out routing resources in a programmable logic device by providing for aggregation of high fan-out routing conductors. Because high fan-out routing resources have lower skew than local routing resources, greater utilization of high fan-out routing resources reduces skew in the programmable logic device. By providing for aggregation of high fan-out routing resources, the present invention increases use of those resources by employing them in applications where traditionally only local routing resources were used (e.g., for local routing of signals). This provides for lower skew on signals that are locally routed using high fan-out routing resources. Aggregation of high fan-out routing resources also leads to greater efficiency in the use of the resources. For example, where regional routing lines can be aggregated to route a signal over a long distance, a national or global routing line may not be required, and the national or global routing line can be reserved for another use.

Figure 1:
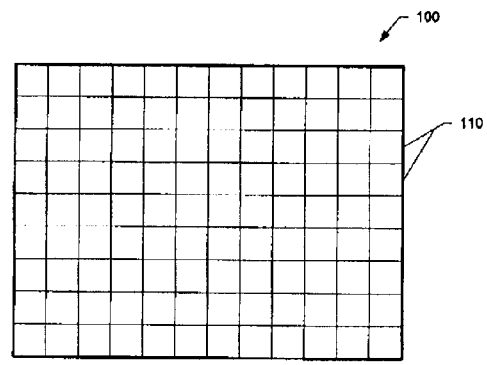
FIG. 1 is a block diagram of a prior art programmable logic device.
Figure 2:
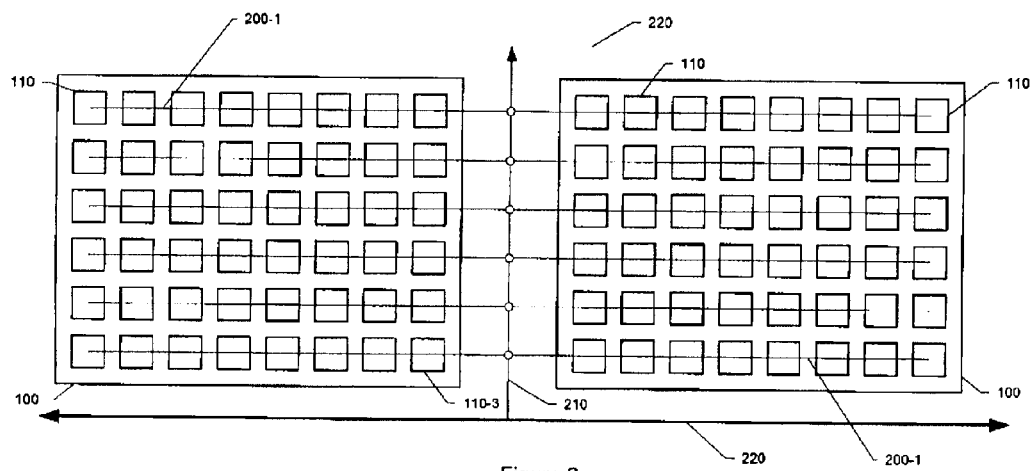
FIG. 2 is a block diagram of a prior art programmable logic device illustrating a prior art signal routing scheme.
Figure 3:
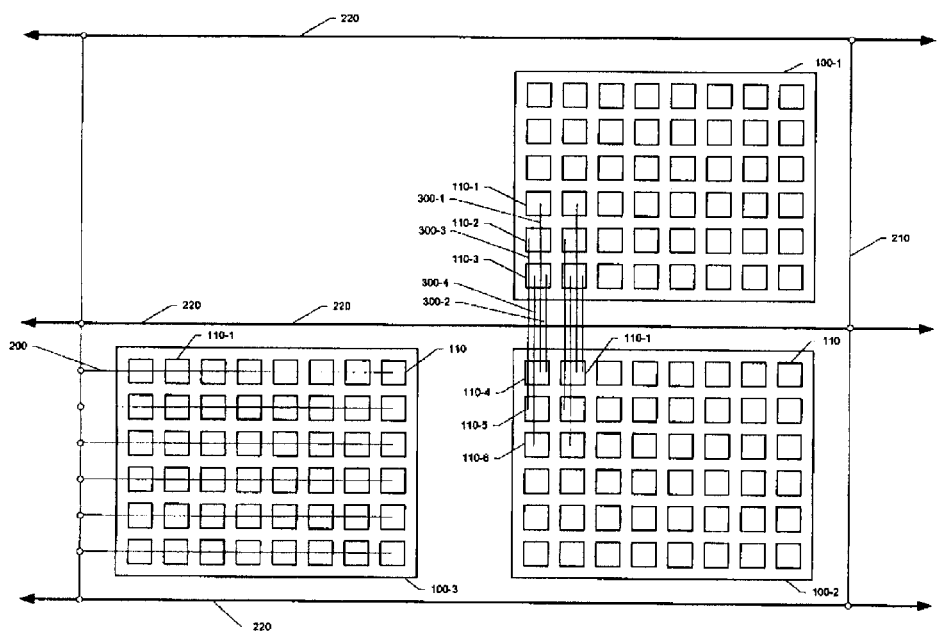
FIG. 3 is a block diagram of a prior art programmable logic device further illustrating a prior art signal routing scheme.
Figure 4:
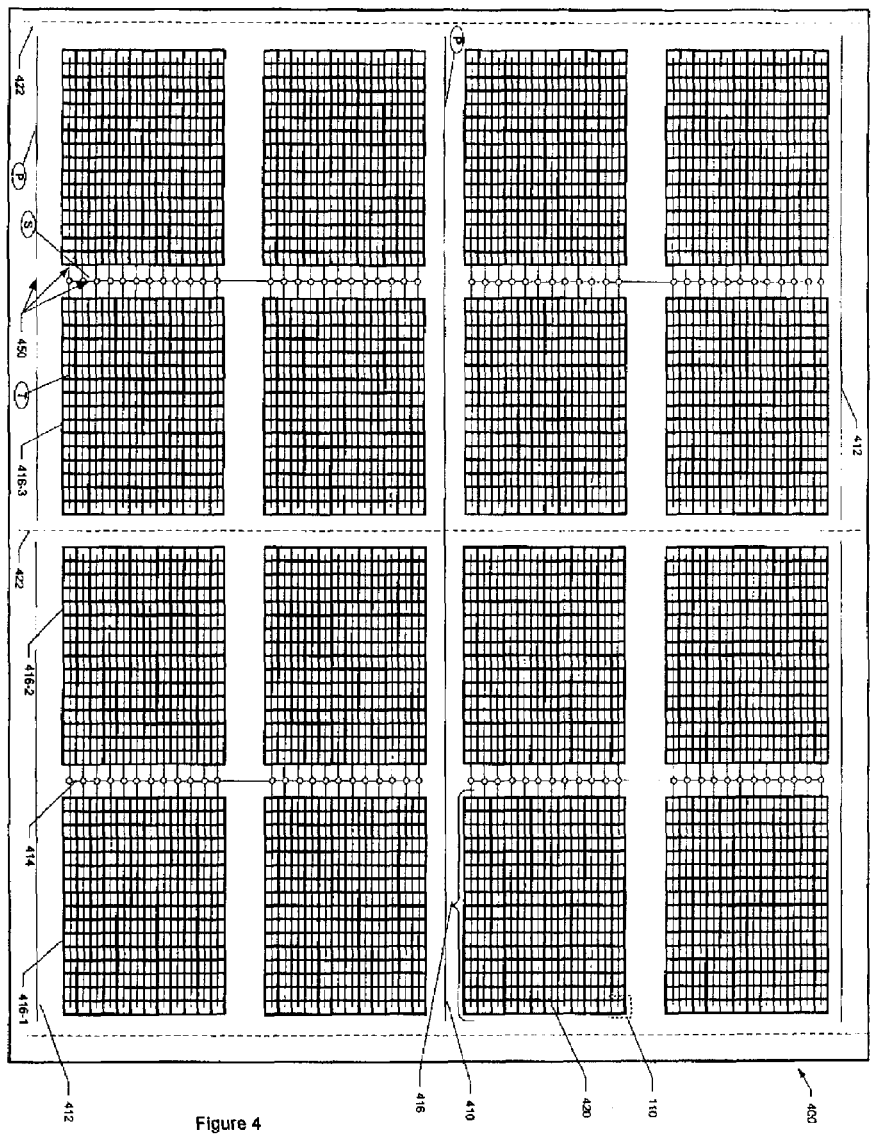
FIG. 4 is a block diagram of an illustrative embodiment of a programmable logic device according to an aspect of the invention.

FIG. 4 is a diagram illustrating one embodiment of the invention implemented within a FPGA. A portion of an FPGA 400 is shown, including configurable logic blocks or programmable logic tiles 110 grouped into tile blocks 416. High fan-out routing resources 450 are shown in FIG. 4 connecting the various tile blocks 416. Persons of ordinary skill in the art will understand that routing lines (conductors) are shown in FIG. 4 and described as single conductors, but may, in fact, be implemented as multiple conductors connected through circuitry omitted for clarity. For example, regional vertical conductor 414 may in fact be a routing channel containing multiple parallel conductors. In one embodiment of the invention, regional vertical conductor 414 represents 9 conductors grouped in units of 3, so that every third row of tiles connects to one of the 3 units of conductors. In addition to connecting tile blocks 416, some of high fan-out routing conductor lines 450 connect to input/output ("I/O") circuits (not shown in FIG. 4). The high fan-out resources 450 include global horizontal conductors 410, national horizontal conductors 412, regional vertical conductors 414, and regional horizontal conductors 420.

A "global" conductor is a routing line that spans substantially all of the length of a relevant portion of the tile blocks in a programmable logic device. In the embodiment of the invention shown in FIG. 4, global horizontal conductors 410 span the entire length of all tile blocks of the device. Global horizontal conductors 410 may carry signals from one side of FPGA 400 to the other.

A "national" conductor is a routing line that is shorter than a global conductor, but still spans a substantial length of the programmable logic device (i.e., a substantial number of tile blocks). In the embodiment of the invention shown in FIG. 4, national horizontal conductors 412 extend across one-half of the tile blocks of the FPGA, and are also connectable to I/O pads through various circuitry (not shown). The FPGA portion 400 shown in the example of FIG. 4 is a 4×4 array of tile blocks, so each national conductor spans two tile blocks. In another embodiment where the relevant FPGA portion is, e.g., an 8×8 array of tile blocks, the national conductor spans 4 tile blocks.

High fan-out routing lines may be structured in a hierarchy according to which groups of lines can drive other groups of lines. In the embodiment of the invention shown in FIG. 4, the global and national routing lines form a "primary" level of a high fan-out routing hierarchy. The global and national horizontal routing lines are labeled "P" in FIG. 4 to reflect their inclusion in the primary level of the hierarchy of high fan-out routing resources.

Also connectable to the I/O pads in some embodiments of the invention (as discussed below) are regional vertical conductors 414. Regional conductors are also high fan-out routing resources, but are generally (though not necessarily) shorter than global and national conductors. In the embodiment shown in FIG. 4, regional vertical conductors 414 span two tile blocks. The regional vertical conductors form a secondary level of the high fan-out routing hierarchy, as designated by the "S" label in FIG. 4. As a secondary routing resource, regional vertical conductors may be driven by primary routing resources, but may not drive primary routing resources.

In the embodiment shown in FIG. 4, regional horizontal conductors 420 span the width of a tile block 416. Each regional horizontal conductor extends from a regional vertical conductor 414 on one side of a tile block to the opposite side of the tile block, passing through each tile 110 in its row, as shown in FIG. 4. Adjacent tile blocks 416 may be electrically isolated from each other or they may be electrically coupled by connecting regional horizontal lines 420 from adjacent blocks to the shared regional vertical line 414. Adjacent tile blocks 416 may share regional vertical lines 414, as shown in FIG. 4. Areas of electrical isolation 422 separate a row of tiles in one column of tiles from the row of tiles in the next column over and may also be referred to as a clock gaps 422.

The regional horizontal conductors form a tertiary level of the high fan-out routing hierarchy, as designated by the "T" label in FIG. 4. As a tertiary routing resource, regional horizontal conductors may not drive secondary or primary routing lines. In the presently described embodiment of the invention, tertiary routing lines may be driven only by secondary routing lines, and not by primary routing lines. Persons of ordinary skill in the art will understand, however, that the present invention may be implemented with a variety of hierarchies of high fan-out routing lines, including those with more or fewer than three hierarchy levels, and those where lines lower in the hierarchy may be driven by all lines higher in the hierarchy (e.g., a tertiary line may be driven by a secondary or a primary line). In addition, any level of a hierarchy could include vertical conductors, horizontal conductors, or both, depending on how conductors are grouped.

Because global, regional, and national conductors 410, 412, 420, and 414 cross substantial portions of the programmable logic device, and contact a large number of tiles, they have high fan-out. However, because they do not pass through many programmable cells, they have low skew. Therefore they are suited to implementing the present invention.

Figure 4A:
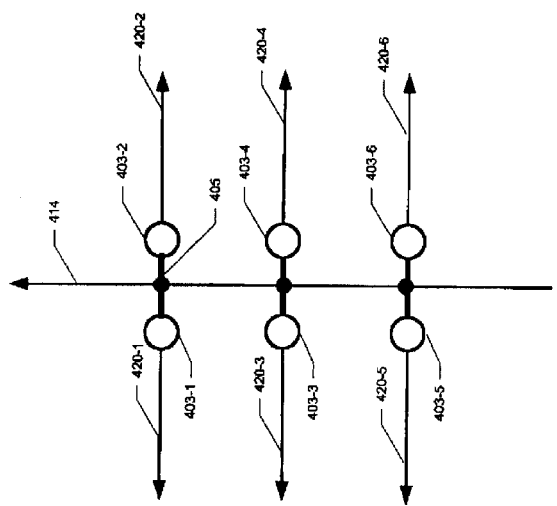
FIG. 4A is a schematic diagram of an illustrative embodiment of programmable routing lines according to an aspect of the invention.

Referring now to FIG. 4A, the layout of regional horizontal conductors 420 and regional vertical conductor 414 is shown in more detail. Programmable elements 403 may be volatile or non-volatile switches or cells comprised of multiple switches, such as volatile or non-volatile transistors or fuses or antifuses, or other known programmable technology. Vias 405 connect programmable elements 403 to regional vertical conductors 414. In order to connect regional horizontal conductor 420-1 to regional vertical conductor 414, programmable element 403-1 would be programmed. Regional vertical conductor 414 would then drive regional horizontal conductor 420-1. Regional vertical conductor 414 may be made to drive regional horizontal conductors 420-2 and 420-3 as well by programming programmable elements 403-2 and 403-3. If it is desired to connect two regional horizontal conductors (e.g., 420-1 and 420-2) to each other without connecting them to the regional vertical conductor 414, they may be connected via local routing lines.

Referring back to FIG. 4, tile blocks 416 are further connected together by inter- and intra-tile local routing conductors, which are omitted from FIG. 4 for clarity. Local routing lines may include lines of various lengths such as, for example local short, long, and very long, conductors connecting tiles in tile blocks 416 together. Typically two or more tiles are connected, and the local conductors may connect tiles only within a given tile block or may connect tiles across separate blocks, carrying signals from one tile to another. Local conductors have high skew because they pass through several programmable devices.

Figure 5:
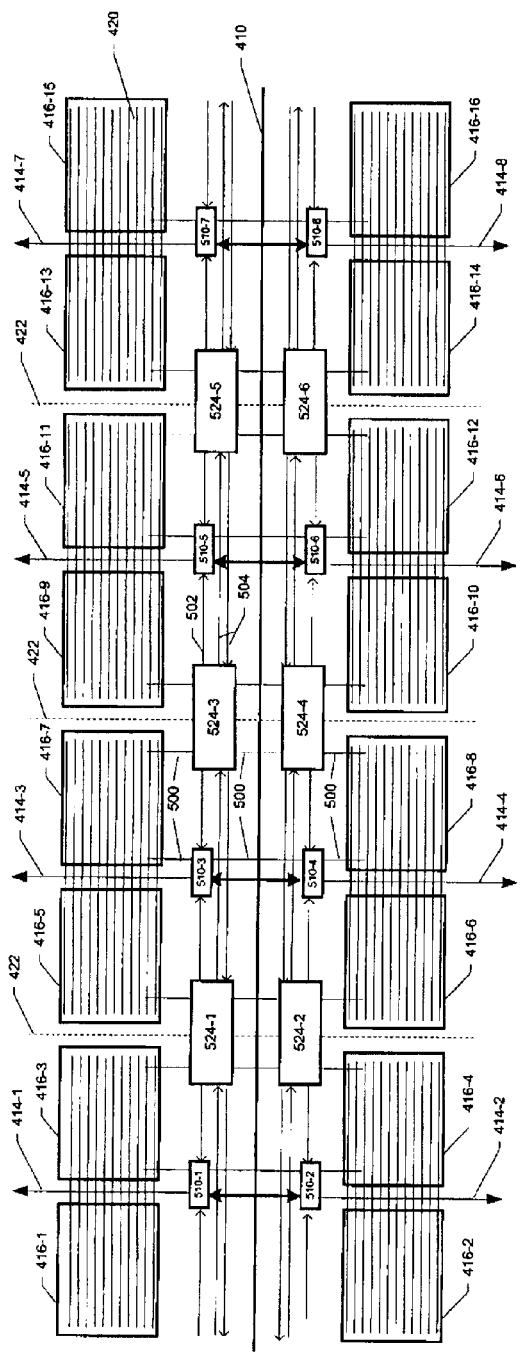
FIG. 5 is a block diagram of an illustrative embodiment of a programmable logic device including a routing aggregation scheme according to an aspect of the invention.

FIG. 5 shows an 8×2 array of tile blocks 416 with primary routing resources (horizontal global line 410), secondary routing resources (vertical regional conductors 414), and tertiary routing resources (horizontal regional conductors 420). FIG. 5 also shows selected local routing lines 500. Persons skilled in the art will understand that only the portion of local routing lines desired to illustrate the invention are shown and many other local routing resources present in an actual device are not shown.

Aggregation interconnects 524 reduce skew and signal delay by routing signals that typically travel over low fan-out local conductors (with high skew) to high fan-out conductors (with low skew). An aggregation interconnect is a circuit that connects two or more high fan-out routing lines. Aggregation interconnects include signal select circuitry such as a multiplexer, and may include other circuits such as buffers. As used in this disclosure, the term multiplexer is used in the functional sense, referring to any circuit with a "many-to-one" function. Examples of such circuits include: AND/OR, wired AND, wired OR, and tri-state net circuits.

As will be explained in more detail below, aggregation interconnects 524 allow signals from a tile block 416 to be routed to multiple regional vertical lines 414, as opposed to just the regional vertical line 414 adjacent to the tile block 416. Furthermore, aggregation interconnects 524 may be located advantageously for reducing the skew of signals that would otherwise pass through multiple conductors. In the embodiment shown in FIG. 5, aggregation interconnects 524 are located at areas of electrical isolation ("clock gaps") 422.

The clock gaps 422 are equidistant from the regional vertical conductors 414 to which they may be connected, and therefore a signal routed to an aggregation interconnect 524 will arrive at two regional vertical conductors 414 at the same time, and will have no skew.

Local vertical conductors 500 connect tile blocks 416 to aggregation interconnects 524. In this embodiment, each local vertical conductor 500 that is connectable to an aggregation interconnect 524 links one of the tile blocks 416 located above a global horizontal conductor 410 to a tile block 416 located below the same global horizontal conductor 410, as well as to the aggregation interconnects 524 through which local routing line 500 passes. Each aggregation interconnect 524 is also connectable to multiple regional vertical conductors 414, via regional vertical line driver circuits 510, as shown in FIG. 5. Line driver circuits are circuits that insert signals onto regional routing lines. Line driver circuits may include multiplexers or other signal select circuitry.

In the embodiment shown in FIG. 5, each aggregation interconnect 524 is connectable to the aggregation interconnects 524 immediately to its left and right via aggregation source lines 504. Each aggregation source line 504 acts as an input to one aggregation interconnect 524 and an output from another aggregation interconnect 524, as indicated by the signal direction arrows shown on source lines 504 in FIG. 5.

Regional vertical line drivers 510 are insertion points for routing signals onto regional vertical lines 414. Regional vertical line drivers 510 may be programmed to select signals to drive regional vertical lines 414 from a variety of sources. A regional vertical line driver 510 may route a signal from a tile block 416 directly to a regional vertical line 414 via a local vertical routing line 500. Alternatively, a signal may be routed to drive a regional vertical line 414 from an aggregation interconnect 524 via a driver source line 502 (driver source lines 502 act as outputs from aggregation interconnects 524 and inputs to regional vertical line drivers 510). In a third alternative, a regional vertical line 414 (secondary resource) may be driven by a signal from a global (primary) resource, such as a global horizontal routing line 410 input to the regional vertical line driver 510, as shown in FIG. 5.

An FPGA may include left input/output (I/O) pads, top I/O pads, right I/O pads, or bottom I/O pads (or any combination thereof). The I/O pads provide input and output for the FPGA and may be connected to routing lines and tiles via buffers and other input/output circuitry (not shown). Global horizontal conductors may run, through circuitry not illustrated, from left I/O pads to right I/O pads, and thereby span the entire length of all tile blocks of the device. Global horizontal conductors may carry signals from one side of FPGA 400 to the other. A "national" conductor is a routing line that is shorter than a global conductor, but still spans a substantial length (i.e., a substantial number of tile blocks).

Places where signals from the local routing lines (not shown in FIG. 5) may be inserted onto the high fan-out routing lines are referred to as insertion points. In one embodiment, the insertion points are at the I/Os, the junctions of the primary/secondary routing lines, and the junctions of the secondary/tertiary routing lines.

In one example of a routing structure on which the present invention could be implemented, primary routing lines can reach thousands of tiles, secondary routing lines can reach hundreds of tiles, and tertiary routing lines can reach tens of tiles. For example, a regional horizontal conductor may reach 10 tiles, a regional vertical conductor may reach 10 regional horizontal conductors, and a global horizontal conductor may reach 10 regional horizontal conductors. A single global horizontal line can then reach 1000 tiles, a regional vertical conductor can reach 100 tiles, and a regional horizontal conductor can reach 10 tiles. In this example, if there is a signal that needs to reach 200 tiles, the aggregation scheme of the present invention allows the connecting of multiple regional vertical conductors without using a global or national horizontal conductor. The connection of two regional vertical conductors is balanced so that the skew of the signal from the connection to the tiles is predictable and minimal. Without the aggregation scheme of the present invention, there may be no way to route, for example, both a signal needing to reach 500 tiles and a signal needing to reach 200 tiles, where there is only a single global horizontal line.

One of ordinary skill in the art will recognize that routing of signals from tile blocks 416 to regional vertical conductors 414 is governed by circuit configurations. Fewer or greater numbers of interconnects may be provided, or different levels of interconnectivity may be designed into aggregation interconnects 524. Although programmable elements are generally not shown for clarity, persons of ordinary skill in the art will understand that connections shown in the figures are generally programmable connections and routing lines, interconnects, and drivers are programmably connectable to one another. Programmable elements may be comprised of fuse or antifuse elements, volatile transistors, such as SRAM memory cells, or non-volatile transistors, such as floating gate, SONOS, nano-crystal, solid-electrolyte switching devices, and other types as will be appreciated by persons of ordinary skill in the art. The exemplary embodiment is limited to that which lends clarity to the invention without unnecessary complication. Furthermore, many conductors herein have been described as a single conductor but may, in fact, be implemented as multiple conductors connected through circuitry omitted for clarity. For example regional vertical conductor 414 may in fact be a routing channel containing multiple parallel conductors.

Figure 6:
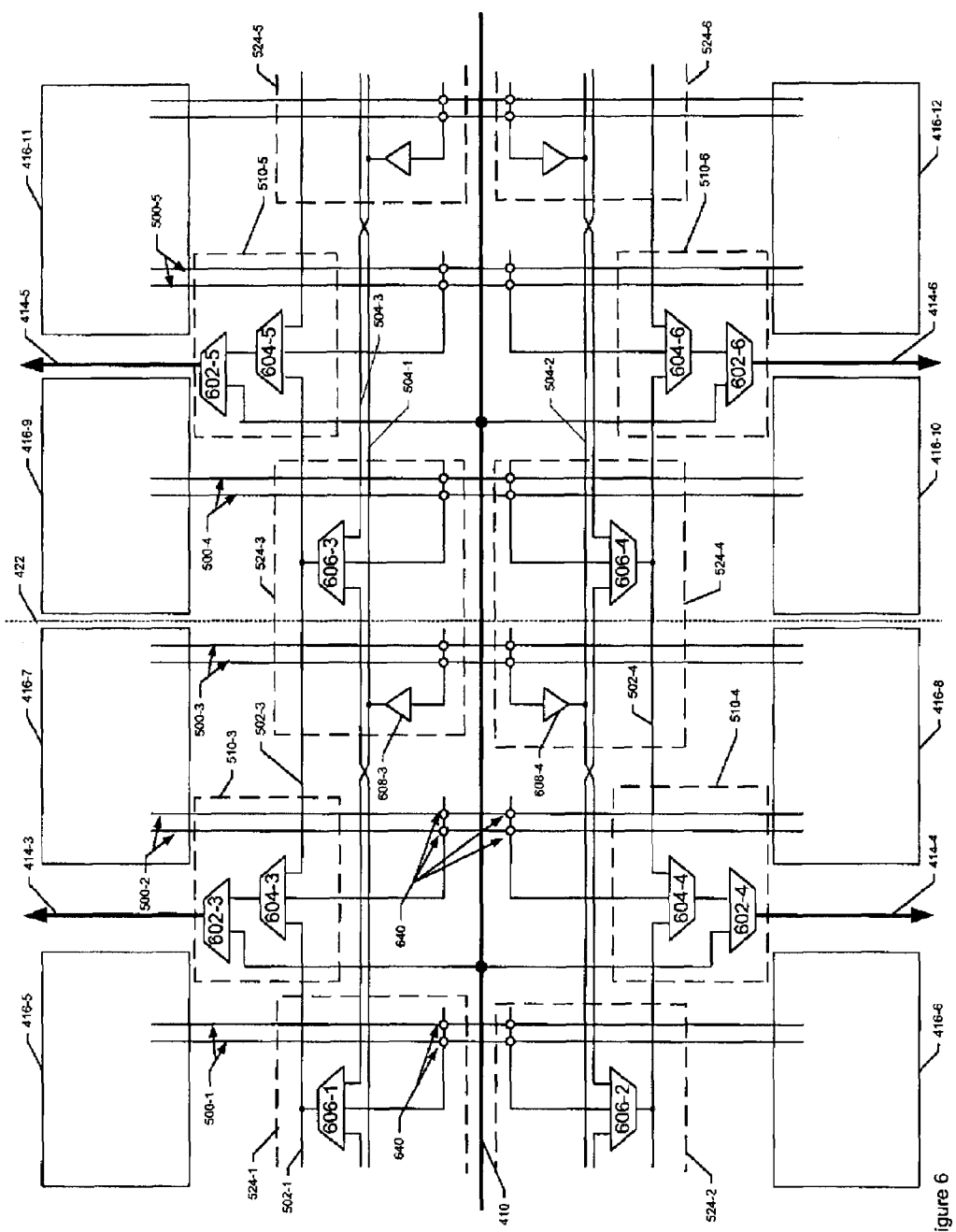
FIG. 6 is a schematic diagram of an illustrative embodiment of a programmable logic device including a routing aggregation scheme according to an aspect of the invention.

FIG. 6 is a schematic diagram illustrating one embodiment of an aggregation interconnect scheme according to the invention. FIG. 6 shows a portion of a device such as the one illustrated in FIG. 5 in more detail. FIG. 6 includes an embodiment of circuitry that may be used to implement the aggregation interconnects 524 and regional vertical line drivers 510 shown as boxes in FIG. 5. For clarity, simplified versions of aggregation interconnects 524 and regional line drivers 510 are shown in FIG. 5. For example, an aggregation interconnect shown in FIG. 5 as having a single multiplexer may in fact contain multiple multiplexers (e.g., 6) and handle multiple (e.g., 6) sets of routing lines.

Aggregation interconnects 524 perform multiplexing functions, and may be alternatively referred to as aggregation multiplexers, although other forms of aggregation interconnect circuits known in the art, may be used to implement the aggregation scheme of the present invention. Aggregation interconnect 524-3 connects (i.e., is programmably connectable) to tile blocks 416-7 and 416-9 through local vertical conductors 500-3 and 500-4. Signals may be routed from aggregation interconnect 524-3 to aggregation interconnects 524-1 and 524-5 via aggregation source lines 504. In FIG. 6, aggregation interconnects 524-3 and 524-4 are shown in full, while aggregation interconnects 524-1, 524-5, 524-2, and 524-6 are only partially shown, as indicated by the open boxes. Signals may also be routed from aggregation interconnect 524-3 to regional vertical line drivers 510-3 and 510-5 via driver source line 502.

The operation of regional vertical line driver 510-3 will now be explained as an illustrative example, based on the exemplary embodiment shown in FIG. 6. Output multiplexer 602-3 receives inputs from global horizontal conductor 410 and signal multiplexer 604-3. Output multiplexer 602-3 may be configured to transmit either of these signals to regional vertical conductor 414-3. A signal output from signal multiplexer 604-3 may come from aggregation multiplexers 524-1 or 524-3, via driver source lines 502. Signal multiplexer 604-3 may also receive a signal from a local vertical routing line 500-2. Any of these signals (or no signal) may be passed from signal multiplexer 604-3 to output multiplexer 602-3, according to the configuration of signal multiplexer 604-3.

Programmable elements shown as open circles 640 provide programmable connections between routing lines and various circuit elements (e.g., other routing lines and multiplexers). For example, programmable elements 640 connected to local vertical conductors 500-2 provide a programmable connection between the conductors and signal multiplexers 604-3 and 604-4. For example, by selecting the appropriate programmable element(s) 640, a signal may be routed from a local vertical conductor 500-2 to regional vertical conductor 414-3, through signal multiplexer 604-3, and then on to an output multiplexer 602-3. Additionally, a signal may pass directly between tile block 416-7 and tile block 416-8, via local vertical conductors 500-2.

The operation of aggregation interconnect 524-3 will now be explained as an illustrative example, based on the exemplary embodiment shown in FIG. 6. Aggregation interconnect 524-3 includes buffer 608-3 that is programmably connectable to local vertical conductors 500-3 via programmable elements 640. In one embodiment, buffer 608-3 is a by-4 driver. Aggregation multiplexer 606-3 can output a signal to regional vertical line drivers 510-3 and 510-5, via driver source line 502. Aggregation multiplexer 606-3 can receive signals from local vertical routing lines 500-4 or from aggregation interconnects 524-1 or 524-5, via aggregation source lines 504, as shown in FIG. 6. Aggregation multiplexer 606-3 provides output to signal multiplexers 604-3 and 604-5, while aggregation multiplexer 510-2 provides output to signal multiplexers 604-1 and 604-3. Aggregation interconnect 524-3 may route a signal from local vertical routing lines 500-3 to aggregation interconnects 524-1 and 524-5 via buffer 608-3 and an aggregation source line 504.

Figure 5A:
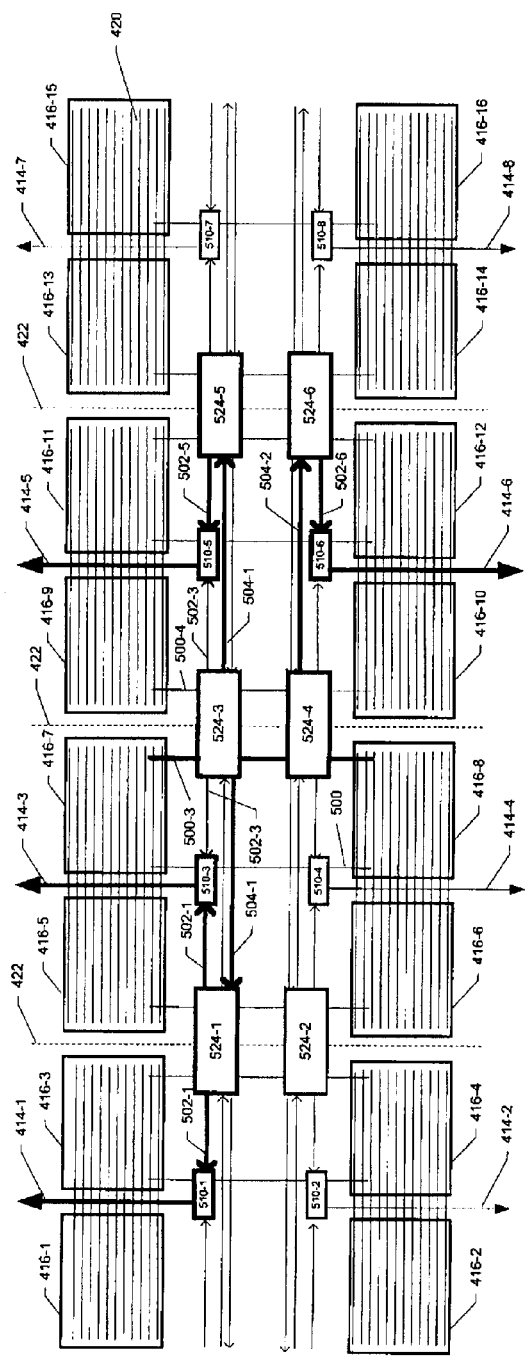
FIG. 5A is a block diagram of an illustrative embodiment of a programmable logic device including a routing aggregation scheme according to an aspect of the invention illustrating the routing of an exemplary signal.

An example of a high-fan-out signal requiring routing in an FPGA device will be illustrated with references to FIGS. 5A and 6. In this example, according to a user circuit design to be implemented on an FPGA, a signal originating from a core tile in tile block 416-7 is connected to local vertical routing line 500-3 and must be routed to multiple various locations on the FPGA device. In this example, the 500-3 signal must be routed to regional vertical conductors 414-1, 414-3, 414-5, and 414-6 for distribution to various tile blocks programmably connectable to those regional vertical conductors.

As will be seen in this example, the signal from line 500-3 will achieve wide distribution on low-skew routing resources without requiring use of global conductor 410 (shown in FIG. 5, omitted for clarity in FIG. 5A), which will remain available to route another signal. FIG. 5A illustrates the various connections employed in routing a signal from local line 500-3 to regional vertical conductors 414-1, 414-3, 414-5, and 414-6. The connection lines used are illustrated with heavy lines, as shown in FIG. 5A.

By programming the relevant programmable elements 640, local routing line 500-3 is connected to aggregation source lines 504-1 and 504-2 via buffers 608-3 and 608-4. Aggregation multiplexers 606-1, 606-5, and 606-6 are configured by programmable elements controlling select lines (not shown), as is known in the art, to select the input signal from aggregation source lines 504-1 and 504-2 for output on driver source lines 502-1 and 502-6. Aggregation multiplexers 606-5 and 606-6 are not shown in FIG. 6, but are understood from the structure of the figure to be the aggregation multiplexers of aggregation interconnects 524-5 and 524-6, which are only partially shown in FIG. 6.

From the driver source lines 502, the signal is input to the regional vertical line drivers 510-1, 510-3, 510-5, and 510-6. The signal is input to multiplexers 604-1 (not shown), 604-3, 604-5, and 604-6 in regional vertical line drivers 510-1, 510-3, 510-5, and 510-6. Signal multiplexers 604-1, 604-3, 604-5, and 604-6 and output multiplexers 602-1, 602-3, 602-5 and 602-6 may be configured to output the signal to regional vertical conductors 414-1, 414-3, 414-5, and 414-6, aggregating these conductors into a signal distribution network.

As can be seen from the heavy lines in FIG. 5A, the signal from local routing line 500-3 travels the same path length from aggregation interconnect 524-3 to reach each regional vertical conductor 414 to which it is routed. For example, the signal travels the lengths of 504-2 and 502-6 to reach 414-6 and travels the lengths of 504-1 and 502-1 to reach 414-1, even though the signal could conceivably be routed on 502-4 to reach 414-6. By choosing routing paths with equal lengths, the skew on the signal is minimized. In referring to paths with the "same" or "equal" lengths, it is to be understood that what is referred to is paths of essentially or approximately equal lengths from a timing standpoint.

In a separate example, a signal from local routing line 500-4 may also be routed to regional vertical conductor 414-1, via aggregation interconnect 524-1 and regional vertical line driver 510-1. In the particular embodiment shown in FIG. 6, there is no direct connection from local routing line 500-4 to aggregation source line 504-1, so the signal must be routed from local routing line 500-4 to local routing line 500-3, via local horizontal routing lines (not shown). In an alternative embodiment, local routing lines such as 500-4 are connectable to aggregation source lines in the aggregation interconnects through which they run. This may be done, for example, by adding a programmable connection between local routing line 500-4 and buffer 608-3 in the aggregation interconnect. In the embodiment shown in FIG. 6, careful selection, during place and route, of the tile block in which a signal driver is located can avoid the necessity of connecting two local routing lines to achieve the desired distribution of the signal.

In order to route a signal from 500-4 to regional vertical conductor 414-1, local routing line 500-4 is connected to local routing line 500-3 via a local horizontal routing line. The signal is then routed from local routing line 500-3 to aggregation source line 504-1 via buffer 608-3 by programming the relevant programmable elements 640. The signal is thereby input to aggregation interconnect 524-1 via aggregation multiplexer 606-1. Aggregation multiplexer 606-1 may be configured to output the signal to regional vertical conductor 414-1, via driver source line 502-1.

Figure 7:
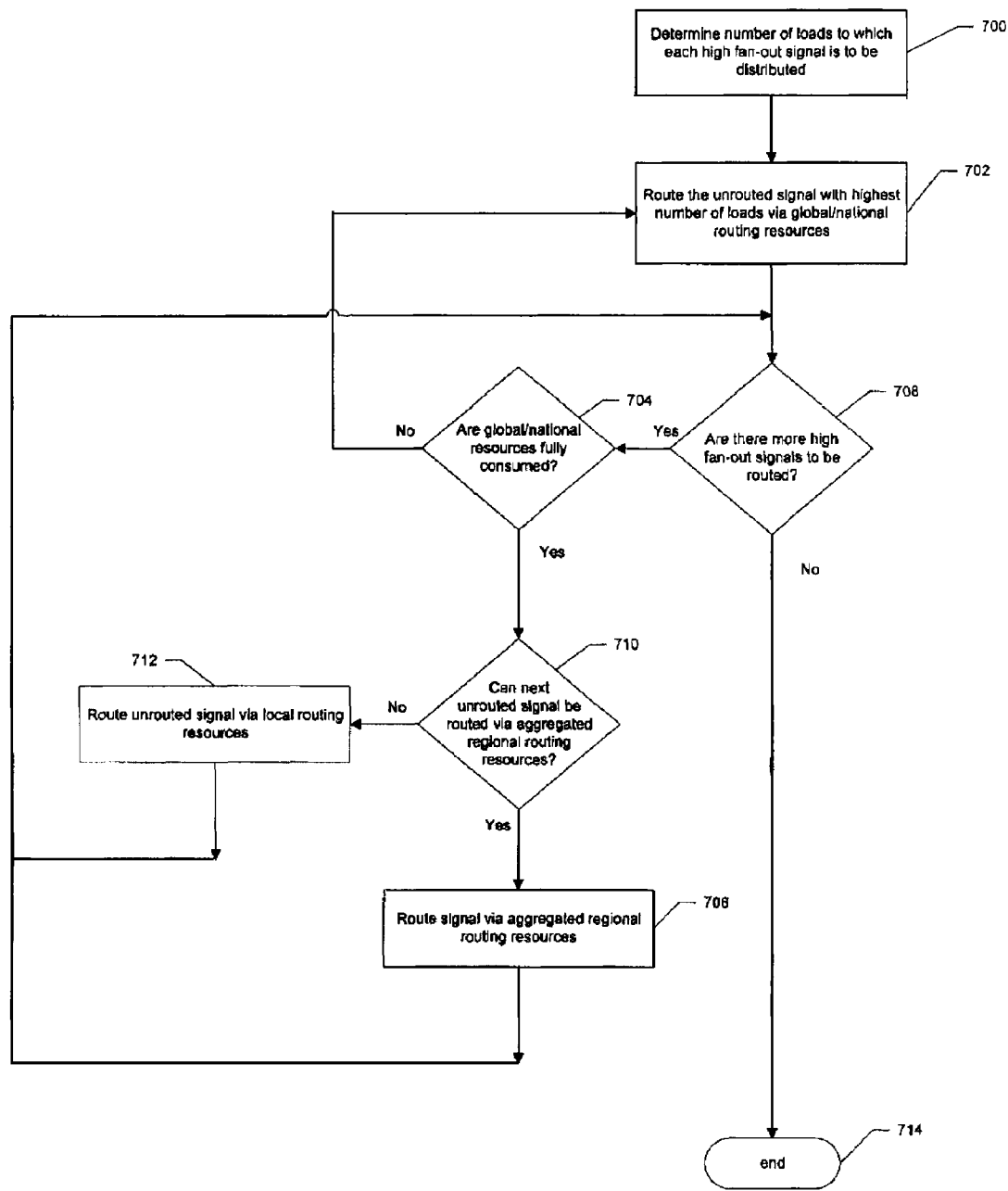
FIG. 7 is a flow diagram according to an illustrative embodiment of a method of the invention.

FIG. 7 shows a flow diagram of a method according to the present invention. This method may be implemented automatically in software such as standard place-and-route software offered by programmable logic device suppliers (see, e.g., Libero™ software offered by Actel Corporation, Mountain View, Calif.). While portions of the method illustrated in FIG. 7 may be implemented to operate automatically in software, portions may be controlled directly by a circuit designer (user), through software or otherwise, who is implementing a circuit in programmable logic. Once the user circuit design has been fully placed and routed, including input and control from the user, if any, the design may be implemented in a programmable logic device by programming the relevant programmable elements to configure the specified logic and routing resources.

In step 700, the number of loads (i.e., the number of locations on the programmable logic device) to which high fan-out signals to be routed in the user design is determined. The greater the number of loads, the higher the fan-out of the signal, and the greater the need for low-skew routing resources. In step 702, a routing path is determined for the signal with the highest number of loads that has not yet been routed, using global or national routing resources. Either global or national routing lines may be selected according to where on the device the signal must be routed, preserving the global lines for when they are fully needed.

In step 708, it is determined whether there is another high fan-out signal to be routed. If there is not, the process terminates at 714. If there is, in step 704, it is determined whether there are any remaining global or national routing resources available for routing high fan-out signals. If the global/national routing lines are not fully utilized, the method returns to step 702 to route the next high fan-out signal. If the global/national routing lines are fully consumed, it is determined in step 710 whether the high fan-out signal can be routed using aggregated regional routing resources. If it can, the signal is then routed in step 706, via aggregated regional routing resources, as described above in reference to FIGS. 4–6. The process then returns to step 708 to determine if there are any more high fan-out signals to be routed. If it is determined in step 710 that a signal cannot be routed using aggregated regional resources, the signal is routed via local routing resources in step 712, as is known in the art. The process then returns to step 708 to determine if there are any more high fan-out signals to be routed.

A person skilled in the art will recognize from the previous description and from the figures and claims that modifications and changes can be made to the invention without departing from the scope of the invention defined in the following claims.

What is claimed is:

1. A signal routing architecture for a programmable logic device comprising:
 a plurality of configurable logic blocks;
 a plurality of high fan-out routing lines;
 a plurality of local routing lines programmably coupleable to ones of said configurable logic blocks and programmably coupleable to ones of said high fan-out routing lines;
 an aggregation interconnect programmably coupleable to ones of said local routing lines and ones of said high fan-out routing lines;
 wherein:
 the aggregation interconnect is configurable to receive a signal from one of the local routing lines and route the signal to at least two of the high fan-out routing lines;
 the aggregation interconnect is configurable to electrically connect at least one of the high fan-out routing lines with at least one other of the high fan-out routing lines;
 wherein a path length from the aggregation interconnect to each of the at least two high fan-out routing lines is the same.

2. The signal routing architecture of claim 1, wherein:
the plurality of high fan-out routing lines is organized into a hierarchy including a first set of high fan-out routing lines and a second set of high fan-out routing lines, the first set of high fan-out routing lines programmably coupleable to the second set of high fan-out routing lines; and
the aggregation interconnect is configurable to electrically connect one of the first set of high fan-out routing lines with another of the first set of high fan-out routing lines without routing the signal over any of the second set of high fan-out routing lines.

3. The signal routing architecture of claim 2, wherein the first set of high fan-out routing lines is higher in the routing hierarchy than the second set of high fan-out routing lines.

4. The signal routing architecture of claim 2, wherein the second set of high fan-out routing lines is higher in the routing hierarchy than the first set of high fan-out routing lines.

5. A signal routing architecture for a programmable logic device comprising:
a plurality of configurable logic blocks;
a plurality of high fan-out routing lines including global and regional routing lines;
a plurality of local routing lines programmably coupleable to ones of said configurable logic blocks and programmably coupleable to ones of said regional routing lines;
an aggregation interconnect programmably coupleable to ones of said local routing lines and ones of said regional routing lines;
a regional line driver circuit configurable to receive a signal from at least one aggregation interconnect and to receive a signal from at least one of at least one local routing line and at least one global routing line;
wherein:
the aggregation interconnect is configurable to receive a signal from one of the local routing lines and route the signal to at least one of the regional routing lines; and
the aggregation interconnect is configurable to connect at least two of the regional routing lines.

6. The signal routing architecture of claim 5, wherein the aggregation interconnect is comprised of at least one multiplexer.

7. The signal routing architecture of claim 5, wherein the aggregation interconnect is further comprised of at least one buffer.

8. The signal routing architecture of claim 5, wherein the regional line driver circuit is comprised of at least one multiplexer.

9. The signal routing architecture of claim 5, further wherein the regional line driver circuit configurable to receive a signal from at least two aggregation interconnects, at least one local routing line, and at least one global routing line.

10. The signal routing architecture of claim 5, further comprising a plurality of aggregation interconnects and a plurality of regional line driver circuits, wherein at least one aggregation interconnect is configurable to route a signal to two nearest-neighbor aggregation interconnects and two nearest-neighbor regional line driver circuits.

11. The signal routing architecture of claim 10, wherein the at least one aggregation interconnect is equidistant from two nearest-neighbor aggregation interconnects and equidistant from two nearest-neighbor regional line driver circuits.

12. The signal routing architecture of claim 11, wherein the at least one aggregation interconnect is connectable to at least four regional routing lines via equal path lengths passing through at least two nearest-neighbor aggregation interconnects.

* * * * *